(12) United States Patent
Kim (10) Patent No.: US 10,170,201 B2
(45) Date of Patent: Jan. 1, 2019

(54) DATA STORAGE DEVICE AND OPERATING METHOD THEREOF

(71) Applicant: SK hynix Inc., Gyeonggi-do (KR)

(72) Inventor: Sang Gon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 294 days.

(21) Appl. No.: 15/159,421

(22) Filed: May 19, 2016

(65) Prior Publication Data

US 2017/0154657 A1 Jun. 1, 2017

(30) Foreign Application Priority Data

Nov. 27, 2015 (KR) ........................ 10-2015-0167846

(51) Int. Cl.
| | |
|---|---|
| G11C 29/00 | (2006.01) |
| G11C 29/52 | (2006.01) |
| G11C 7/00 | (2006.01) |
| G06F 11/10 | (2006.01) |
| G11C 11/56 | (2006.01) |
| G11C 29/04 | (2006.01) |

(52) U.S. Cl.
CPC .............. G11C 29/52 (2013.01); G06F 11/10 (2013.01); G06F 11/1048 (2013.01); G06F 11/1068 (2013.01); G11C 7/00 (2013.01); G11C 11/5642 (2013.01); *G11C 2029/0411* (2013.01)

(58) Field of Classification Search
CPC ........ G06F 11/1068; G06F 11/10; G11C 7/00; G11C 29/52; G11C 11/5642; G11C 2029/0411

USPC ......................... 714/721, 763, 764, 773, 774
See application file for complete search history.

(56) References Cited

U.S. PATENT DOCUMENTS

| | | | | |
|---|---|---|---|---|
| 9,530,513 | B1* | 12/2016 | Pan ....................... | G11C 16/32 |
| 2008/0062758 | A1* | 3/2008 | Honma ................ | G11C 11/5642 365/184 |
| 2012/0140560 | A1* | 6/2012 | Yang ....................... | G06F 3/064 365/185.18 |
| 2012/0327708 | A1* | 12/2012 | Du ........................ | G11C 13/0004 365/163 |
| 2014/0173346 | A1* | 6/2014 | Bastimane ............. | G11B 5/012 714/30 |
| 2014/0268391 | A1* | 9/2014 | Liao .................. | G11B 20/10046 360/45 |

(Continued)

FOREIGN PATENT DOCUMENTS

| | | |
|---|---|---|
| KR | 1020130084901 | 7/2013 |
| KR | 1020150044753 | 4/2015 |

*Primary Examiner* — Albert Decady
*Assistant Examiner* — Osman M Alshack
(74) *Attorney, Agent, or Firm* — IP & T Group LLP (57) ABSTRACT

A data storage device includes a memory device including memory regions classified into a plurality of memory groups each corresponding to a plurality read bias voltage groups; and a controller suitable for: performing for a target memory region a read retry operation based on a first read bias voltage group corresponding to a memory group in which the target memory region is included, and performing an additional read retry operation based on at least one of remaining read bias voltage groups excluding the first read bias voltage group among the plurality of read bias voltage groups, according to a result of the read retry operation.

20 Claims, 8 Drawing Sheets

(56) References Cited

U.S. PATENT DOCUMENTS

| | | | |
|---|---|---|---|
| 2015/0293813 A1* | 10/2015 | Lin | G06F 11/1012 714/764 |
| 2016/0011807 A1* | 1/2016 | Seol | G11C 11/5628 711/102 |
| 2016/0011970 A1* | 1/2016 | Sakurada | G11C 11/5628 711/103 |
| 2017/0125128 A1* | 5/2017 | Lee | G11C 29/1201 |

* cited by examiner

→ Read retry (410)

FIG.4B

High separation (432)

FIG.4C

Low separation (434)
→ Additional read retry (440)

FIG.4D

High separation (436)

DATA STORAGE DEVICE AND OPERATING METHOD THEREOF

CROSS-REFERENCES TO RELATED APPLICATION

The present application claims priority under 35 U.S.C. § 119(a) to Korean application number 10-2015-0167846, filed on Nov. 27, 2015, in the Korean Intellectual Property Office, which is incorporated herein by reference in its entirety.

BACKGROUND

1. Technical Field

Various embodiments generally relate to a data storage device, and, more particularly, to a data storage device including a semiconductor memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards to external devices.

SUMMARY

In an embodiment, a data storage device may include: a memory device including memory regions classified into a plurality of memory groups each corresponding to a plurality read bias voltage groups; and a controller suitable for: performing for a target memory region a read retry operation based on a first read bias voltage group corresponding to a memory group in which the target memory region is included, and performing an additional read retry operation based on at least one of remaining read bias voltage groups excluding the first read bias voltage group among the plurality of read bias voltage groups, according to a result of the read retry operation.

In an embodiment, a data storage device may include: a memory device including a plurality of memory regions which are classified into a plurality of memory groups, and a controller suitable for performing, for a target memory region, a read retry operation based on a first read bias voltage group among a plurality of read bias voltage groups, corresponding to a first memory group in which the target memory region is included, determining error estimation indexes respectively corresponding to read bias voltage sets included in the first read bias voltage group, according to a result of the read retry operation, selecting a second read bias voltage group corresponding to a second memory group among the plurality of read bias voltage groups, based on the error estimation indexes, and performing an additional read retry operation for the target memory region, based on the second read bias voltage group.

In an embodiment, a method for operating a data storage device may include: performing, for a target memory region, a read retry operation based on a first read bias voltage group among a plurality of read bias voltage groups, corresponding to a first memory group in which the target memory region is included; determining error estimation indexes respectively corresponding to read bias voltage sets included in the first read bias voltage group, according to a result of the read retry operation; selecting a second read bias voltage group corresponding to a second memory group among the plurality of read bias voltage groups, based on the error estimation indexes; and performing an additional read retry operation based on the second read bias voltage group for the target memory region.

DETAILED DESCRIPTION

Hereinafter, various embodiments of the invention, including a data storage device and an operating method thereof will be described with reference to the accompanying drawings. The present invention may, however, be embodied in different forms and should not be construed as being limited to the embodiments set forth herein. Rather, these embodiments describe the present invention in sufficient detail to enable a person skilled in the art to which the invention pertains to practice the invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

Figure 1:
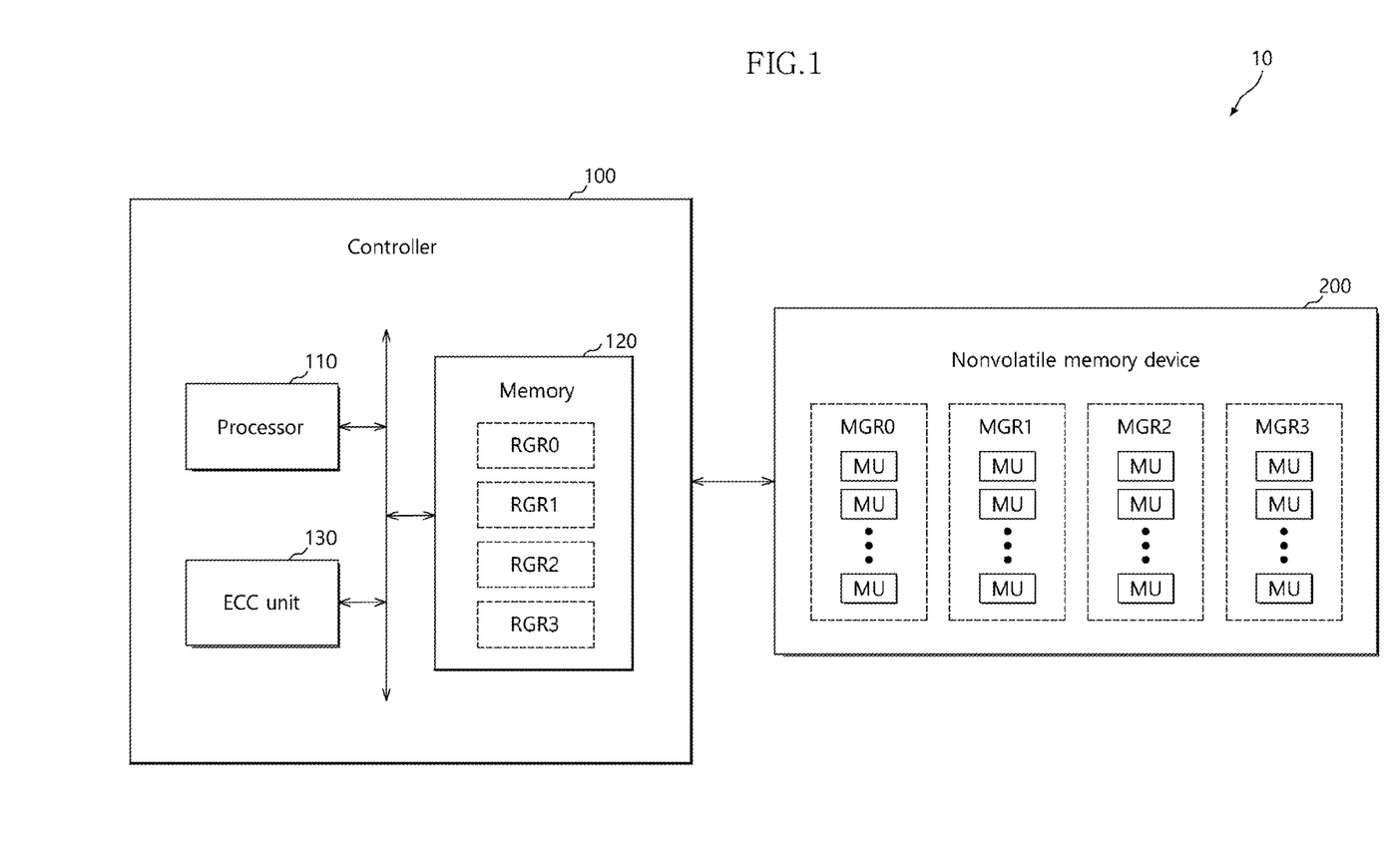
FIG. 1 is a block diagram illustrating a data storage device, including a controller and a memory device, according to an embodiment of the invention.

Referring now to FIG. 1 a data storage device 10 is provided, according to an embodiment of the invention.

The data storage device 10 may be configured to store data provided from an external device (not shown), in response to a write request the external device. Also, the data storage device 10 may be configured to provide stored data to an external device, in response to a read request from the external device.

The data storage device 10 may be prepared in the form of a personal computer memory card international association (PCMCIA) card, a compact flash (CF) card, a smart media card, a memory stick, various multimedia cards (e.g., MMC, eMMC, RS-MMC, and MMC-Micro), various secure digital cards (e.g., SD, Mini-SD, and Micro-SD), a universal flash storage (UFS), a solid state drive (SSD) and the like.

The data storage device 10 may include a controller 100 and a memory device 200.

The controller 100 may include a processor 110, a memory 120, and an error correction code (ECC) unit 130.

The processor 110 may control general operations of the data storage device 10. The processor 110 may store data in the memory device 200 in response to a write request transmitted from the external device. The processor 110 may read data stored in the memory device 200 and transfer the read data to the external device in response to a read request transmitted from the external device.

The processor 110 may classify memory regions MU into, a plurality of memory groups, for example, 4 memory groups MGR0 to MGR3, according to attributes of the memory regions MU. The memory groups MGR0 to MGR3 may correspond to read bias voltage groups RGR0 to RGR3, respectively. The read bias voltage groups may include a plurality of read bias voltage sets. For example, the processor 110 may classify the memory regions MU into the memory groups MGR0 to MGR3 according to the write/erase cycles for each region. For example, the memory regions MU may be classified into the memory groups MGR0 to MGR3 sequentially in an increasing write/erase cycles order. For example, amongst the memory groups MGR0 to MGR3, the memory group MGR0 may include memory regions MU having the smallest number write/erase cycles where the memory group MGR3 may include memory regions MU having the highest number of write/erase cycles.

When an error correction operation for the data read from a target memory region of the memory device 200 has failed, the processor 110 may perform a read retry operation for the target memory region. For the target memory region, the processor 110 may perform the read retry operation based on a read bias voltage group corresponding to a memory group in which the target memory region is included. Depending upon the result of the read retry operation, the processor may perform an additional read retry operation based on at least one of the remaining read bias voltage groups.

The processor 110 may perform the read retry operation for the target memory region, based on a first read bias voltage group corresponding to the memory group in which the target memory region is included. If the read retry operation based on the first read bias group did not succeed, the controller 110 may calculate a plurality of error estimation indexes corresponding to a plurality of respective first read bias voltage sets included in the first read bias voltage group. The controller 110 may then select a second read bias voltage group corresponding to a second memory group among the plurality of read bias voltage groups RGR0 to RGR3. The second read bias voltage group may be selected based on the error estimation indexes so that it may have a greater probability to succeed. The controller 110 may perform the additional read retry operation for the target memory region, based on the second read bias voltage group. An additional read retry operation may be iterated until the operation is a success or the last read bias voltage set has been already used.

The memory 120 may serve as a working memory, a buffer memory or a cache memory of the processor 110. The memory 120 as a working memory may store software programs and various program data to be driven by the processor 110. The memory 120 as a buffer memory may buffer the data transmitted between the external device and a storage medium. The memory 120 as a cache memory may temporarily store cache data.

The memory 120 may store the read bias voltage groups RGR0 to RGR3 as illustrated in FIG. 1. The read bias voltage groups RGR0 to RGR3 may be stored in the memory device 200, and be used by being loaded on the memory 120 in case of need, for example, upon power-on.

The ECC unit 130 may perform an error correction operation by decoding data read from the memory device 200 according to an ECC algorithm.

For example, the ECC unit 130 may generate a syndrome according to the ECC algorithm, when performing the error correction operation for data. The ECC unit 130 may determine that data do not include an error bit when all syndrome bits are "0" in the syndrome generated according to the ECC algorithm. Or the FCC unit 130 may determine that data include an error bit when at least one syndrome bit is not "0". Generally, the more syndrome bits have a high cumulative value, the higher is the probability of data to include error bits.

The memory device 200 may include flash memory devices such as a NAND flash or a NOR flash, a ferroelectrics random access memory (FeRAM), a phase-change random access memory (PCRAM), a magnetoresistive random access memory (MRAM), a resistive random access memory (ReRAM) and the like.

The memory device 200 may store data transmitted from the controller 100, read stored data, and transmit read data to the controller 100, under the control of the controller 100.

Figure 2:
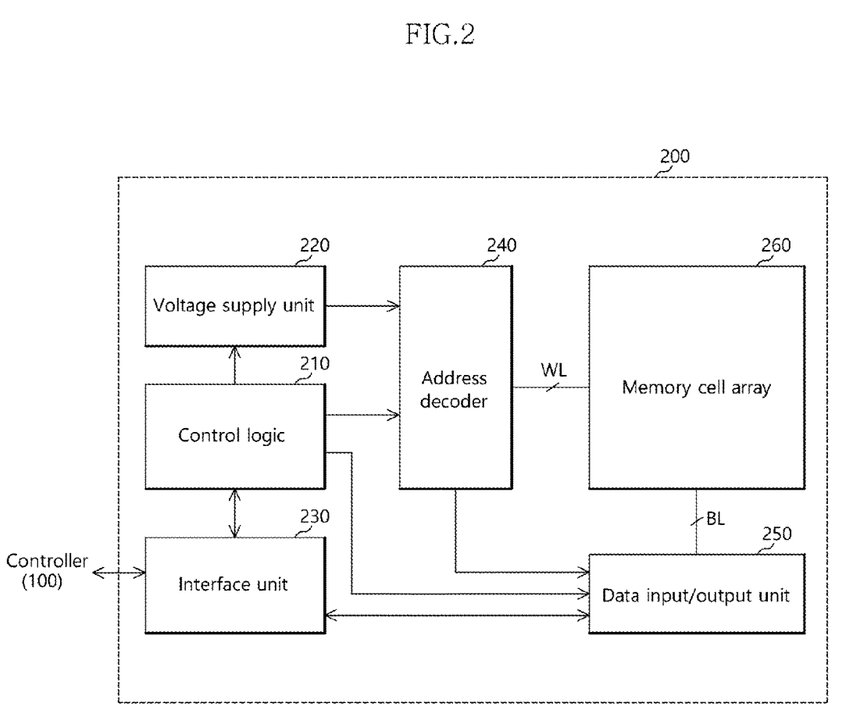
FIG. 2 is a block diagram illustrating an example of a detailed configuration of a memory device, according to an embodiment of the invention.

FIG. 2 is a block diagram illustrating an example of a detailed configuration of the memory device 200 shown in FIG. 1.

Referring to FIG. 2, the memory device 200 may include a control logic 210, a voltage supply unit 220, an interface unit 230, an address decoder 240, a data input/output unit 250, and a memory cell array 260.

The control logic 210 may control general operations of the memory device 200 according to control of the controller 100. The control logic 210 may receive a command transmitted from the controller 100 via the interface unit 230, and may transmit control signals to internal units of the memory device 200 in response to the command. The control logic 210 may set read bias voltages in response to a command for setting read bias voltages. The control logic 210 may perform a read operation based on the set read bias voltages, in response to a read command.

The voltage supply unit 220 may generate various operation voltages necessary for general operations of the memory device 200, according to control of the control logic 210. The voltage supply unit 220 may supply, for example, read bias voltages for the read operation, to the address decoder 240.

The interface unit 230 may exchange various data and control signals including commands, addresses and data with the controller 100. The interface unit 230 may transmit various data and control signals inputted thereto, to the internal units of the memory device 200.

The address decoder 240 may decode addresses to select portions of the memory cell array 260 to be accessed. The address decoder 240 may selectively drive one or more word lines WL and control the data input/output unit 250 to selectively drive one or more bit lines BL, according to decoding results.

The data input/output unit 250 may transmit data received from the interface unit 230, to the memory cell array 260 through the bit lines BL. The data input/output unit 250 may transmit data read from the memory cell array 260 through the bit lines BL, to the interface unit 230. The data input/output unit 250 may sense current formed as memory cells included in the memory cell array 260 are turned on and off in response to read bias voltages, and may acquire data read from the memory cells, according to the current sensing results.

The memory cell array 260 may be coupled with the address decoder 240 through a plurality of word lines WL. The memory cell array 260 may be coupled with the data input/output unit 250 through a plurality of bit lines BL. The memory cell array 260 may include a plurality of memory cells for storing data. The memory cells may be disposed at areas where the word lines WL and the bit lines BL intersect with each other.

Figure 3A:
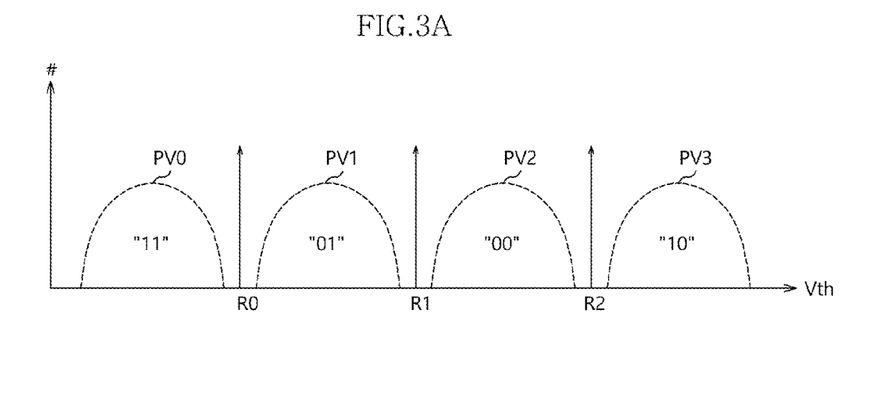
FIG. 3A is a graph illustrating an example of threshold voltage distributions PV0 to PV3 of memory cells of a memory device.

FIG. 3A is a graph illustrating threshold voltage distributions PV0 to PV3 of memory cells. The horizontal axis Vth represents a threshold voltage of a memory cell, and the vertical axis # represent the number of memory cells corresponding to a threshold voltage.

Referring to FIG. 3A, memory cells may form threshold voltage distributions PV0 to PV3 according to data stored therein. When, for example, 2-bit data of "11", "01", "00" or "10" is stored in a memory cell, the memory cell may be controlled to have a threshold voltage corresponding to any one of the 4 threshold voltage distributions PV0 to PV3, according to data stored therein.

Memory cells may be turned on or off in response to read bias voltages R0 to R2 according to threshold voltages thereof. In detail, a memory cell may be turned on when a read bias voltage higher than its threshold voltage is applied, and may be turned off when a read bias voltage lower than its threshold voltage is applied. For example, data "1" may be read when a memory cell is turned on, and, for example, data "0" may be read when a memory cell is turned off. Data may be read by sensing current which is formed as a memory cell is turned on or off. Data read from a memory cell may be different according to a read bias voltage applied to the memory cell.

Data stored in memory cells may be determined based on data read from the memory cells in response to the read biases R0 to R2. For example, data "0" may be read from a memory cell forming the threshold voltage distribution PV2 with respect to the read bias R1 and data "1" may be read from the memory cell with respect to the read bias R2, and, based on these data, data stored in the corresponding memory cell may be determined as "00". In order to read data stored in memory cells, the read biases R0 to R2 may be respectively positioned between the threshold voltage distributions PV0 to PV3 to identify the threshold voltage distributions PV0 to PV3 of the memory cells.

While it is illustrated in FIG. 3A that memory cells form 4 threshold voltage distributions PV0 to PV3 and data are read based on 3 read bias voltages R0 to R2, it is noted that the invention may not be limited in this way. For example, it is noted, that memory cells may form a plurality of threshold voltage distributions according to the number of bits to be stored in each memory cell, and data stored in the memory cells may be read based on a plurality of read bias voltages suitable for identifying the plurality of threshold voltage distributions.

Figure 3B:
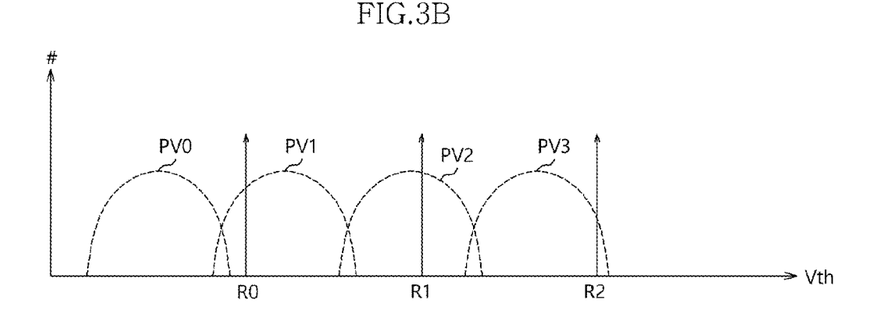
FIG. 3B is a graph illustrating an example of distorted overlapping threshold voltage distributions of memory cells of a memory device.

FIG. 3B is a graph illustrating an example of distorted overlapping threshold voltage distributions PV0 to PV3.

Referring to FIG. 3B, threshold voltages of memory cells may vary by various reasons such as interference between adjacent memory cells, or discharge due to lapse of time. Hence, the threshold voltage distributions PV0 to PV3 may be shifted to overlap with each other as shown, for example, in FIG. 3B. As a result, the read bias voltages R0 to R2 may not be positioned between the threshold voltage distributions PV0 to PV3, and data read from the memory cells may include error bits. In the case where read data include error bits exceeding the error correction capability of the ECC unit 130, the error correction operation may fail.

Figure 3C:
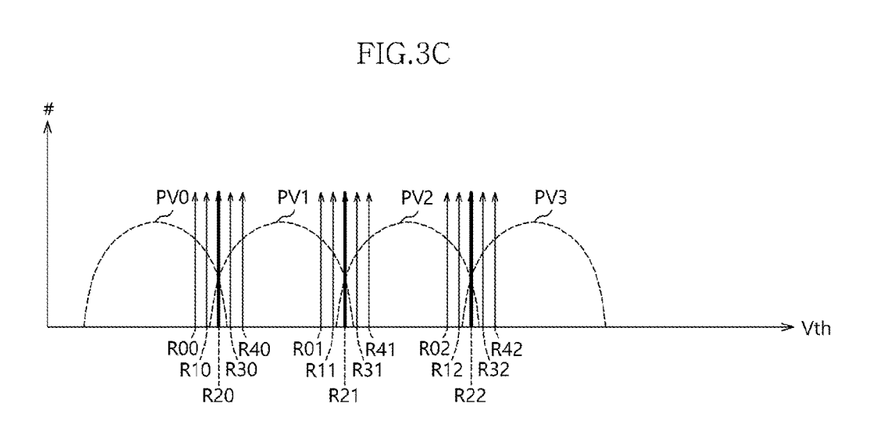
FIG. 3C is a graph illustrating a read retry operation, according to an embodiment of the invention.

The graph of FIG. 3C illustrates a read retry operation. The read retry operation may be performed by the controller 100 shown in FIG. 1.

Referring to FIG. 3C, when the error correction operation for the data read from memory cells has failed, the processor 110 of the controller 100 may perform the read retry operation by resetting the read bias voltages. For the read retry operation, the processor 110 may select a read bias voltage set stored in the read bias voltage group RGR0 including, for example, read bias voltage sets RS0 to RS4 given in the following Table 1. Each of the read bias voltage sets RS0 to RS4 may include read bias voltages.

TABLE 1

| READ BIAS GROUP | READ BIAS SET | READ BIAS VOLTAGES |
| --- | --- | --- |
| RGR0 | RS0 | R00, R01, R02 |
| | RS1 | R10, R11, R12 |
| | RS2 | R20, R21, R22 |
| | RS3 | R30, R31, R32 |
| | RS4 | R40, R41, R42 |

In more detail, the processor 110 may read data based on a selected read bias voltage set from a target memory region including memory cells for which the read retry operation is to be performed, and perform the error correction operation for the read data. The processor 110 may perform the read retry operation until an error correction operation for the data read based on any one of the read bias voltage sets RS0 to RS4 succeeds or all error correction operations for the data read based on the read bias voltage sets RS0 to RS4 fail. For example, the processor 110 may succeed in an error correction operation for the data read based on the read bias voltage set RS2 which has read bias voltages positioned at the valleys of threshold voltage distributions, that is, positioned at levels where the numbers of error bits are smallest, and may end the read retry operation.

The distortion of the threshold voltage distributions PV0 to PV3 may increase as the write/erase cycles of a memory region increase. In an embodiment, different read bias voltage groups RGR0 to RGR3 may be set which take into account the number of the write/erase cycles. Therefore, the processor 110 may classify memory regions into the memory groups MGR0 to MGR3 according to the write/erase cycles, and the memory groups MGR0 to MGR3 may correspond to the respective read bias voltage groups RGR0 to RGR3. The processor 110 may perform the read retry operation for a target memory region, preferentially based on a read bias voltage group corresponding to a memory group to which the target memory region belongs.

Nevertheless, in the case where the read bias voltage group is set to markedly deviate from the valleys of the threshold voltage distributions PV0 to PV3 unlike the illustration of FIG. 3C, the read retry operation may fail. Also, in the case where the number of read bias voltage sets configuring a read bias voltage group decreases and thus the number of possible trial times decreases, the read retry operation may be difficult to succeed. As will be described hereunder, when the read retry operation based on a read bias voltage group corresponding to a target memory region has failed, the processor 110 may perform an additional read retry operation by selecting at least one read bias voltage group having a higher probability of success among the remaining read bias voltage groups.

FIGS. 4A to 4D are graphs illustrating a method for selecting a read bias voltage group for an additional read retry operation. FIGS. 4A to 4D illustrate representative read bias voltages of respective read bias voltage sets RS0 to RS4, instead of all read bias voltages included in the read bias voltage groups RGR0 to RGR3, and optional threshold voltage distributions PV11 and PV12. It is assumed that the processor 110 of the controller 100 has performed the read retry operation (410) based on the read bias voltage group RGR0, for a target memory region.

Figure 4A:
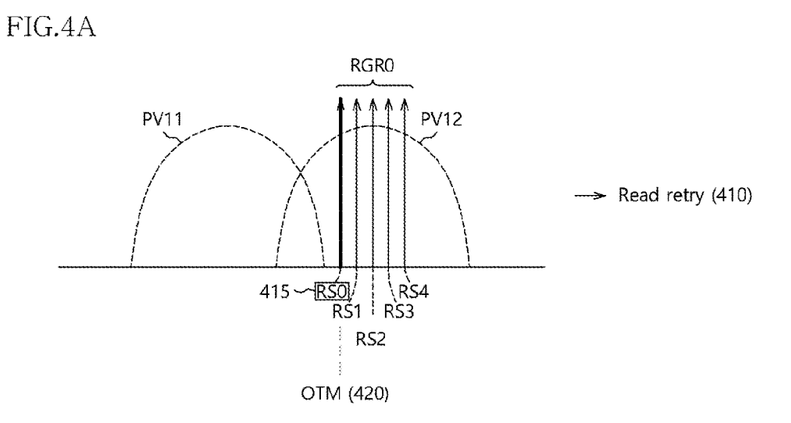
FIGS. 4A to 4D are graphs illustrating a method for selecting a read bias voltage group for a read retry operation, according to an embodiment of the invention.

When the read retry operation based on the read bias voltage group RGR0 has failed, the processor 110 may calculate error estimation indexes corresponding to the respective read bias voltage sets RS0 to RS4 included in the read bias voltage group RGR0. An error estimation index may be an index capable of estimating how many error bits are included in the data read based on a read bias voltage set from a target memory region. The error estimation index may be a value obtained by cumulating syndrome bits calculated for the data. In this case, the smaller the error estimation index is, the higher is the probability that the number of error bits included in the data may be small.

The processor 110 may select (420) an optimal read bias voltage set OTM among the read bias voltage sets RS0 to RS4 included in the read bias voltage group RGR0, based on the error estimation indexes. For example, the processor 110 may select (415) the read bias voltage set RS0 corresponding to a minimal error estimation index, as the optimal read bias voltage set OTM.

The processor 110 may calculate separations of the read bias voltage groups RGR1 to RGR3 with respect to the optimal read bias voltage set OTM. The separations may be calculated based on differences between the optimal read bias voltage set OTM and read bias voltage sets RS0 to RS4, for the respective read bias voltage groups RGR1 to RGR3. When respective read bias voltage sets RS0 to RS4 are set based on offsets with respect to a predetermined default read bias voltage set, the differences between the optimal read bias voltage set OTM and the read bias voltage sets RS0 to RS4 may be calculated based on differences of the offsets. A separation may be lower as a read bias voltage group is closer to the optimal read bias voltage set OTM.

Figure 4B:
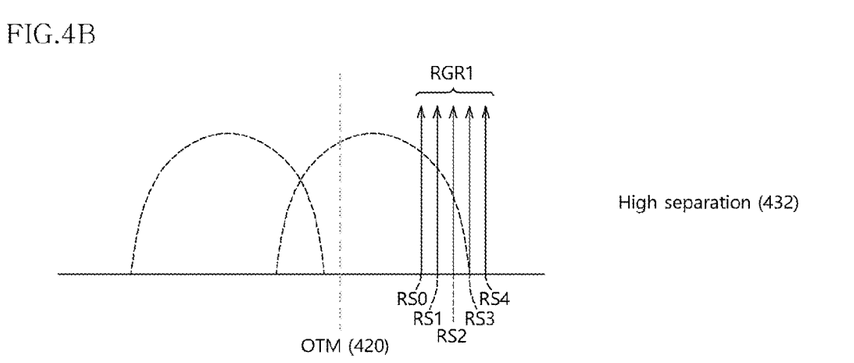
Figure 4C:
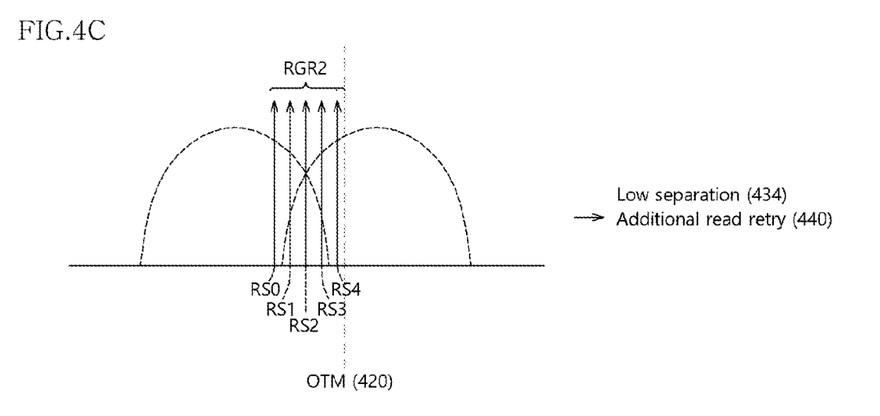
Figure 4D:
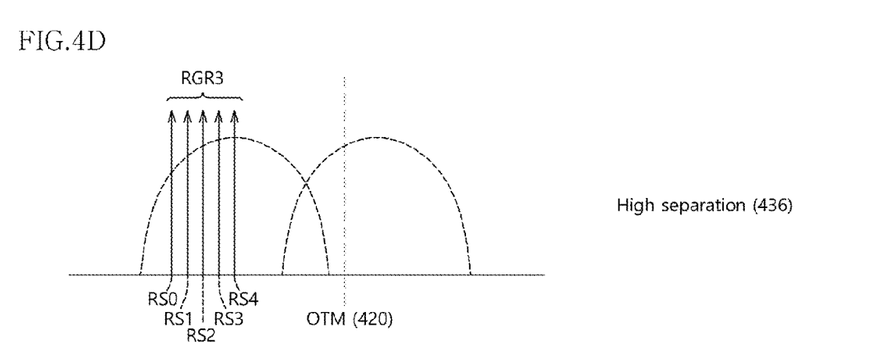

The processor 110 may calculate, for example, values obtained by cumulating differences between the optimal read bias voltage set OTM and the read bias voltage sets RS0 to RS4 or averages of the differences, as the separations, for the respective read bias voltage groups RGR1 to RGR3. The processor 110 may count, for example, read bias voltage sets having differences from the optimal read bias voltage set OTM which are less than a predetermined value, for the respective read bias voltage groups RGR1 to RGR3, and calculate counting values as the separations. For example, it may be determined that the read bias voltage group RGR1 has a high separation (432) as shown in FIG. 4B, the read bias voltage group RGR2 has a low separation (434) as shown in FIG. 4C, and the read bias voltage group RGR3 has a high separation (436) as shown in FIG. 4D.

The processor 110 may select the read bias voltage group RGR2 corresponding to a minimal separation, based on the calculated separations. The processor 110 may perform the additional read retry operation (440) based on the read bias voltage group RGR2, for the target memory region. Since the read bias voltage group RGR2 is closer to the optimal read bias voltage set OTM, the probability that the additional read retry operation may succeed will be higher than if the other read bias voltage groups RGR1 and RGR3 were employed.

According to an embodiment of the invention, even though only a small number of read bias voltage sets are set to a read bias voltage group corresponding to a memory group, it is possible to complement the number of iterations of the read retry operation, by selecting another appropriate read bias voltage group. Accordingly, operational performance of the data storage device 10 may be improved.

According to an embodiment of the invention, the processor 110 may perform the additional read retry operation by selecting a plurality of read bias voltage groups in an order of smaller separation from an optimal read bias voltage.

Figure 5:
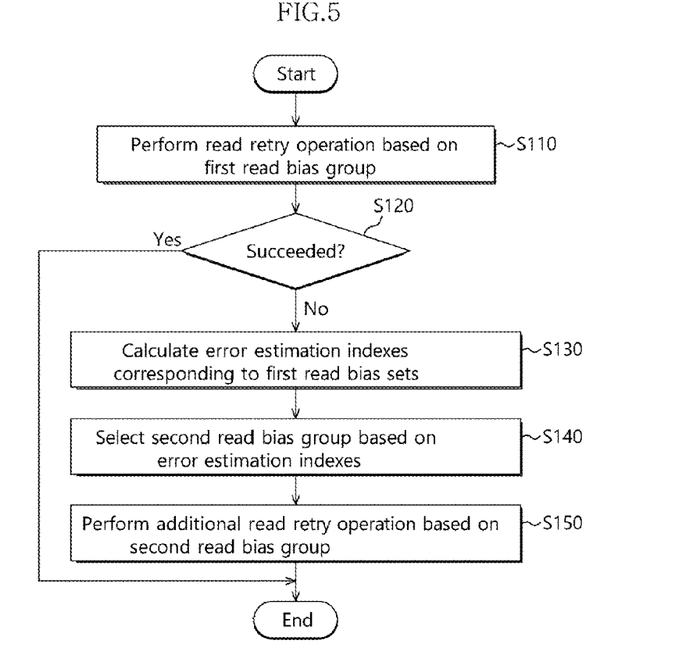
FIG. 5 is a flow chart of a method for operating a data storage device, according to an embodiment of the invention.

Referring now to FIG. 5 a flow chart of a method for operating the data storage device 10 of FIG. 1 is provided according to an embodiment of the invention.

At step S110, the processor 110 included in the controller 100 of the data storage device 10 may perform a read retry operation based on a first read bias voltage group, for a target memory region. The first read bias voltage group may correspond to a first memory group in which the target memory region is included. A method for performing the read retry operation will be described later in detail with reference to FIG. 6.

At step S120, the processor 110 may determine whether the read retry operation has succeeded. The processor 110 may determine that the read retry operation has succeeded, when an error correction operation based on any one among read bias voltage sets included in the first read bias voltage group has succeeded. The processor 110 may determine that the read retry operation has failed, when all error correction operations based on the read bias voltage sets have failed. In the case where the read retry operation has succeeded, the process may be ended. In the case where the read retry operation has failed, the process may proceed to step S130.

At the step S130, the processor 110 may calculate error estimation indexes respectively corresponding to the read bias voltage sets. The error estimation indexes may be values obtained by cumulating syndrome bits calculated for data read based on the read bias voltage sets.

At step S140, the processor 110 may select a second read bias voltage group among the remaining read bias voltage groups, based on the error estimation indexes.

At step S150, the processor 110 may perform an additional read retry operation based on the second read bias voltage group, for the target memory region.

According to an embodiment, although not shown in FIG. 5, in the case where the additional read retry operation based on the second read bias voltage group has failed, a plurality of additional read retry operations may be performed by selecting new read bias voltage groups through the steps S130 and S140, until a read retry operation succeeds or up to a threshold number of trial times.

Figure 6:
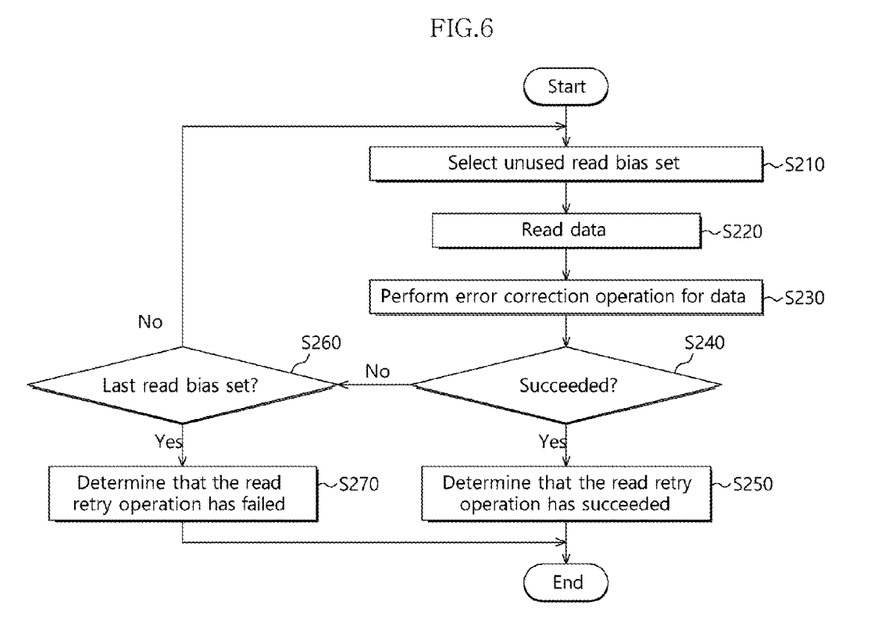
FIG. 6 is a flow chart of a read retry operation method of a data storage device based on a read bias voltage group, according to an embodiment of the invention.

FIG. 6 is a flow chart of a read retry operation method of the data storage device 10 of FIG. 1 based on a read bias voltage group.

At step S210, the processor 110 may select a read bias voltage set which is not used in the read bias voltage group.

At step S220, the processor 110 may read data from the target memory region based on the read bias voltage set. The processor 110 may control the memory device 200 to perform a read operation for the target memory region based on the read bias voltage set.

At step S230, the processor 110 may perform an error correction operation for the read data.

At step S240, the processor 110 may determine whether the error correction operation has succeeded. In the case where the error correction operation has succeeded, the process may proceed to step S250. In the case where the error correction operation has failed, the process may proceed to step S260.

At the step S250, the processor 110 may determine that the read retry operation has succeeded.

At the step S260, the processor 110 may determine whether the used read bias voltage set is a final read bias voltage set in the read bias voltage group. In the case where the used read bias voltage set is a final read bias voltage set, the process may proceed to step S270. In the case where the used read bias voltage set is not a final read bias voltage set, the process may proceed to the step S210. That is to say, the read retry operation may be performed until an error correction operation for the data read based on any one of read bias voltage sets from the target memory region succeeds or all error correction operations for the data read based on the read bias voltage sets from the target memory region fail.

At the step S270, the processor 110 may determine that the read retry operation has failed.

Figure 7:
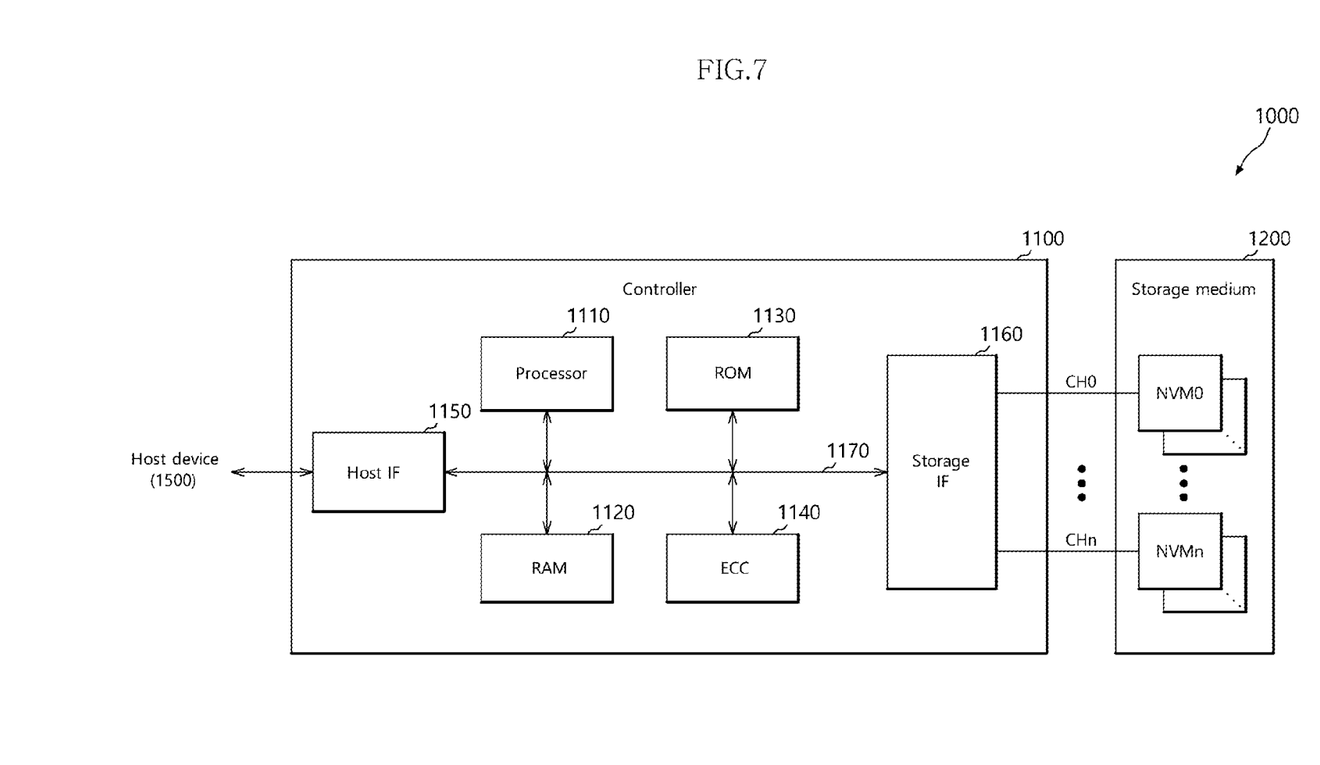
FIG. 7 is a block diagram illustrating a solid state drive (SSD), according to an embodiment of the invention.

FIG. 7 is a block diagram illustrating a representation of an example of a solid state drive (SSD) 1000, according to an embodiment of the invention.

Referring to FIG. 7, the SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface 1150, and a storage medium interface 1160, which are coupled with each other through a bus 1170.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control the internal operations of the SSD 1000, such as a merge operation a wear leveling operation, and so forth.

Also, the processor 1110 may operate in a manner substantially similar to the processor 110 shown in FIG. 1. When an error correction operation for the data read from a target memory region of the storage medium 1200 has failed, the processor 1110 may perform a read retry operation for the target memory region. For the target memory region, the processor 1110 may perform the read retry operation based on a read bias voltage group corresponding to a memory group in which the target memory region is included, and, according to a result of the read retry operation, may perform an additional read retry operation based on at least one of remaining read bias voltage groups.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The FCC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may include the plurality of memory devices NVM0 to NVMn. Each of the plurality of memory devices NVM0 to NVMn may perform a write operation and a read operation according to the control of the controller 1100.

Figure 8:
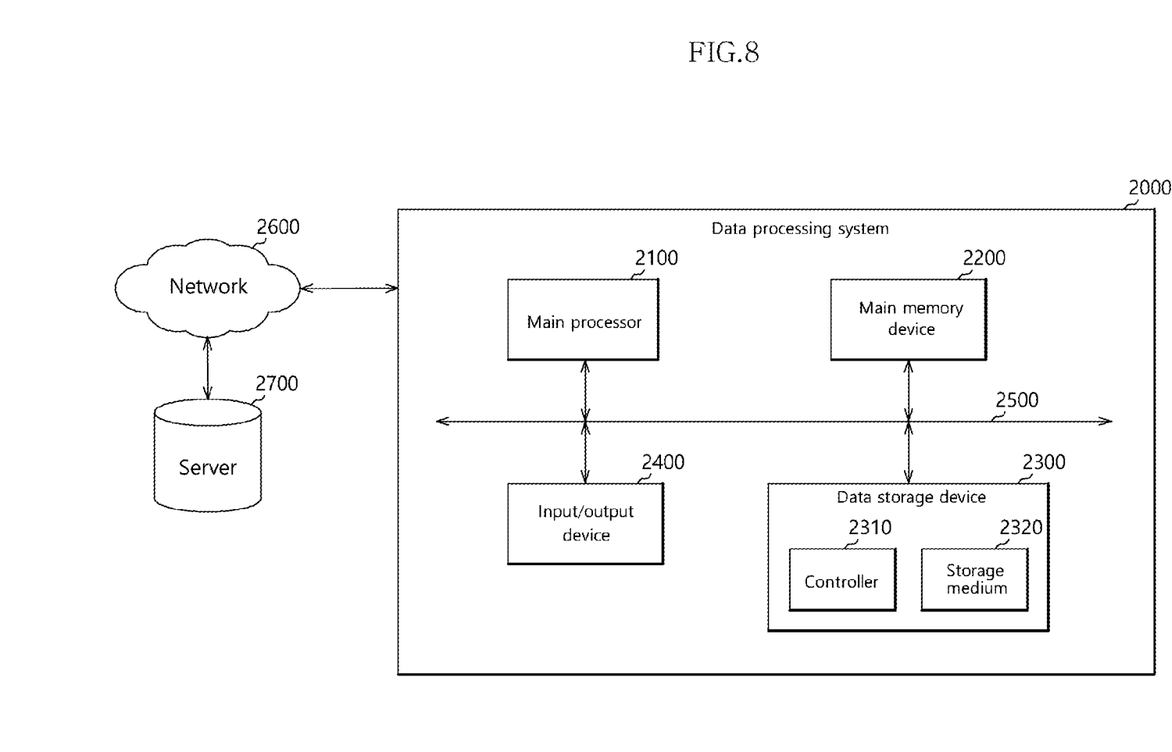
FIG. 8 is a block diagram illustrating a data processing system including a data storage device, according to an embodiment of the invention.

Referring to FIG. 8 a data processing system 2000 is provided, according to an embodiment of the invention.

Referring to FIG. 8, the data processing system 2000 may include a computer, a laptop, a netbook, a smart phone, a digital TV, a digital camera, a navigator, and the like. The data processing system 2000 may include a main processor 2100, a main memory device 2200 a data storage device 2300, and an input/output device 2400. The internal units of the data processing system 2000 may exchange data, control signals, and the like through a system bus 2500.

The main processor 2100 may control general operations of the data processing system 2000. The main processor 2100 may be, for example, a central processing unit such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 shown in FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN) a wide area, network (WAN), a wireless network and so on. The data processing system 2000 may include a network interface (not shown) to access the network 2600.

While various embodiments of the invention have been described above, it will be understood to those skilled in the art that the embodiments described are examples only. Accordingly, the data storage device and the operating method thereof described herein should not be limited based on the described embodiments. Many other embodiments or variations thereof may be envisaged by those skilled in the relevant art without departing from the spirit and or scope of the invention as defined by the following claims.

What is claimed is:

1. A data storage device comprising:
   a memory device including memory regions classified into a plurality of memory groups, each of the plurality of memory groups corresponding to a plurality of read bias voltage groups, each of the plurality of read bias voltage groups including read bias voltage sets, each of the read bias voltage sets including read bias voltages which are expected to be respectively positioned between threshold voltage distributions of memory cells of the memory regions; and
   a controller configured to:
      perform, for a target memory region a read retry operation based on a first read bias voltage group corresponding to a memory group in which the target memory region is included,
      select at least one of remaining read bias voltage groups excluding the first read bias voltage group among the plurality of read bias voltage groups, according to a result of the read retry operation, and
      perform an additional read retry operation for the target memory region based on the at least one of remaining read bias voltage groups.

2. The data storage device according to claim 1, wherein the controller performs the read retry operation by reading data from the target memory region based on a read bias voltage set included in the first read bias voltage group, performing an error correction operation for the data, and iterating reading of new data based on an unused read bias voltage set included in the first read bias voltage group and performing of an error correction operation for the new data according to a result of the error correction operation for the data.

3. The data storage device according to claim 1, wherein the controller performs the read retry operation until an error correction operation for data read from the target memory region based on read bias voltage sets included in the first read bias voltage group succeeds.

4. The data storage device according to claim 1, wherein the controller performs the read retry operation until all error correction operations for data read from the target memory region based on the read bias voltage sets fail.

5. The data storage device according to claim 1, wherein the controller selects an optimal read bias voltage set among read bias voltage sets included in the first read bias voltage group, according to results of error correction operations performed in the read retry operation, and selects a read bias voltage group for the additional read retry operation, based on separations of the remaining read bias voltage groups with respect to the optimal read bias voltage set.

6. A data storage device comprising:
   a memory device including a plurality of memory regions which are classified into a plurality of memory groups, each of the plurality of memory groups corresponding to a plurality of read bias voltage groups, each of the plurality of read bias voltage groups including read bias voltage sets, each of the read bias voltage sets including read bias voltages which are expected to be respectively positioned between threshold voltage distributions of memory cells of the memory regions; and
   a controller configured to perform, for a target memory region, a read retry operation based on a first read bias voltage group among the plurality of read bias voltage groups, corresponding to a first memory group in which the target memory region is included, determine error estimation indexes respectively corresponding to read bias voltage sets included in the first read bias voltage group, according to a result of the read retry operation, select a second read bias voltage group corresponding to a second memory group among the plurality of read bias voltage groups, based on the error estimation indexes, and perform an additional read retry operation for the target memory region, based on the second read bias voltage group.

7. The data storage device according to claim 6, wherein the controller performs the read retry operation by reading data from the target memory region based on a read bias voltage set included in the first read bias voltage group, performing an error correction operation for the data, and iterating reading of new data based on an unused read bias voltage set included in the first read bias voltage group and performing of an error correction operation for the new data, according to a result of the error correction operation for the data.

8. The data storage device according to claim 6, wherein the controller performs the read retry operation until an error correction operation for data read from the target memory region based on the read bias voltage sets succeeds.

9. The data storage device according to claim 6, wherein the controller performs the read retry operation until all error correction operations for data read from the target memory region based on the read bias voltage sets fail.

10. The data storage device according to claim 6, wherein the controller determines the error estimation indexes based on syndromes with respect to data read from the target memory region based on the read bias voltage sets.

11. The data storage device according to claim 6, wherein the controller selects an optimal read bias voltage set among the read bias voltage sets based on the error estimation indexes, determines separations of the plurality of read bias voltage groups with respect to the optimal read bias voltage set, and selects the second read bias voltage group based on the separations.

12. The data storage device according to claim 11, wherein the controller determines each of the separations based on differences between read bias voltage sets included in a corresponding read bias voltage group and the optimal read bias voltage set.

13. The data storage device according to claim 6,
   wherein the controller classifies the memory regions into the plurality of memory groups according to attributes of the memory regions, and
   wherein the plurality of read bias voltage groups respectively correspond to the plurality of memory groups.

14. A method for operating a data storage device, comprising:
   classifying, by a controller, memory regions of a memory device into a plurality of memory groups, each of the plurality of memory groups corresponding to a plurality of read bias voltage groups, each of the plurality of read bias voltage groups including read bias voltage sets, each of the read bias voltage sets including read bias voltages which are expected to be respectively positioned between threshold voltage distributions of memory cells of the memory regions;
   performing, by the controller, for a target memory region, a read retry operation based on a first read bias voltage group among the plurality of read bias voltage groups, corresponding to a first memory group in which the target memory region is included;
   determining, by the controller, error estimation indexes respectively corresponding to read bias voltage sets included in the first read bias voltage group, according to a result of the read retry operation;

selecting, by the controller, a second read bias voltage group corresponding to a second memory group among the plurality of read bias voltage groups, based on the error estimation indexes; and performing, by the controller, an additional read retry operation based on the second read bias voltage group for the target memory region.

15. The method according to claim 14, wherein the performing of the read retry operation comprises:

reading data from the target memory region based on a read bias voltage set included in the first read bias voltage group;

performing an error correction operation for the data; and iterating reading of new data based on an unused read bias voltage set included in the first read bias voltage group and performing of an error correction operation for the new data, according to a result of the error correction operation for the data.

16. The method according to claim 14, wherein the read retry operation is performed until an error correction operation for data read from the target memory region based on any one of the read bias voltage sets succeeds or all error correction operations for data read based on the read bias voltage sets fail.

17. The method according to claim 14, wherein the error estimation indexes are determined based on syndromes with respect to data read from the target memory region based on the read bias voltage sets.

18. The method according to claim 14, wherein the selecting of the second read bias voltage group comprises:

selecting an optimal read bias voltage set among the read bias voltage sets, based on the error estimation indexes;

determining separations of the plurality of read bias voltage groups with respect to the optimal read bias voltage set; and selecting the second read bias voltage group based on the separations.

19. The method according to claim 18, wherein each of the separations is determined based on differences between read bias voltage sets included in a corresponding read bias voltage group and the optimal read bias voltage set.

20. The method according to claim 14, further comprising:

classifying memory regions into a plurality of memory groups, according to attributes of the memory regions, wherein the plurality of read bias voltage groups respectively correspond to the plurality of memory groups.

* * * * *